United States Patent
Katoch et al.

(10) Patent No.: US 11,361,818 B2
(45) Date of Patent: Jun. 14, 2022

(54) MEMORY DEVICE WITH GLOBAL AND LOCAL LATCHES

(71) Applicant: Taiwan Semiconductor Manufacturing Company, Ltd., Hsinchu (TW)

(72) Inventors: Atul Katoch, Kanata (CA); Sahil Preet Singh, Bangalore (IN)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/010,335

(22) Filed: Sep. 2, 2020

(65) Prior Publication Data

US 2021/0098052 A1    Apr. 1, 2021

Related U.S. Application Data (60) Provisional application No. 62/908,075, filed on Sep. 30, 2019.

(51) Int. Cl.
*G11C 11/418* (2006.01)
*G11C 11/412* (2006.01)

(52) U.S. Cl.
CPC .......... *G11C 11/418* (2013.01); *G11C 11/412* (2013.01)

(58) Field of Classification Search
CPC ....... G11C 11/418; G11C 11/412; G11C 8/12; G11C 11/419; G11C 8/10; G11C 7/065
See application file for complete search history.

(56) References Cited

U.S. PATENT DOCUMENTS

| | | | | |
|---|---|---|---|---|
| 6,310,815 B1* | 10/2001 | Yamagata | ................ | G11C 5/14 365/230.03 |
| 6,335,897 B1* | 1/2002 | Yoo | ...................... | G11C 29/808 365/230.03 |
| 6,700,822 B1* | 3/2004 | Wang | ...................... | G11C 8/10 365/189.05 |
| 8,605,523 B2* | 12/2013 | Tao | ........................ | G11C 29/24 365/194 |
| 9,378,789 B2* | 6/2016 | Hoff | ..................... | G11C 7/1084 |
| 9,911,473 B1* | 3/2018 | Singh | ....................... | G11C 7/18 |
| 2006/0028853 A1* | 2/2006 | Osada | ................. | G06F 11/1008 365/63 |
| 2012/0188839 A1* | 7/2012 | Hwang | ................... | G11C 8/12 365/230.06 |
| 2014/0153349 A1* | 6/2014 | Wu | ...................... | G11C 7/1039 365/203 |

(Continued)

*Primary Examiner* — Khamdan N. Alrobaie
(74) *Attorney, Agent, or Firm* — Merchant & Gould P C.

(57) ABSTRACT

A memory device includes a memory bank with a memory cell connected to a local bit line and a word line. A first local data latch is connected to the local bit line and has an enable terminal configured to receive a first local clock signal. A word line latch is configured to latch a word line select signal, and has an enable terminal configured to receive a second local clock signal. A first global data latch is connected to the first local data latch by a global bit line, and the first global data latch has an enable terminal configured to receive a global clock signal. A global address latch is connected to the word line latch and has an enable terminal configured to receive the global clock signal. A bank select latch is configured to latch a bank select signal, and has an enable terminal configured to receive the second local clock signal.

20 Claims, 9 Drawing Sheets

(56) References Cited

U.S. PATENT DOCUMENTS

2016/0086644 A1* 3/2016 Hong ................... G11C 7/1087
  365/230.03
2020/0020386 A1* 1/2020 Yu ......................... G11C 11/419

* cited by examiner

MEMORY DEVICE WITH GLOBAL AND LOCAL LATCHES

PRIORITY CLAIM AND CROSS-REFERENCE

This application claims priority to U.S. Provisional Patent Application No. 62/908,075, filed Sep. 30, 2019, the disclosure of which is hereby incorporated by reference in its entirety.

BACKGROUND

A common type of integrated circuit memory is a static random access memory (SRAM) device. A typical SRAM memory device has an array of memory cells. Each memory cell uses six transistors, for example, connected between an upper reference potential and a lower reference potential (typically ground) such that one of two storage nodes can be occupied by the information to be stored, with the complementary information stored at the other storage node.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices, such as static random access memory (SRAM), have memory cells arranged in an array of rows and columns. The memory cells are connected to a row decoder via word lines. Additionally, the memory cell array contains bit lines connecting the columns of a plurality of individual memory cells to an Input/Output (I/O) block. Thus, the bit lines of each column are respectively coupled to a plurality of memory cells that are disposed in that column, and each memory cell in that column is arranged on a different row and coupled to a respective word line.

In some memory devices, the memory array may be divided into sub-banks of smaller memory cell arrays, with the bit lines of the sub-banks connected to local I/O blocks to transmit and receive information therefrom. The local I/Os exchange information with a global I/O using global bit lines. Such memory devices may provide address and data latches at the memory device interface (boundary) in the global I/O block, where read/write addresses and read/write data may be temporarily stored for reading/writing to the memory cells.

However, such address and data information is required at the local I/Os and memory banks themselves, which are physically separated from the latches in the global I/O at the device boundary. For instance, in a write operation if the memory device attempts to transmit new address and/or data information from the latches in the global I/O to the local I/O(s) and memory banks before a previous write operation is complete, a "collision" can occur where the memory device attempts send new data and address information from the global I/O to the local I/Os before the previous write operation is complete. To address this issue, some devices extend the falling edge of the clock pulses controlling the latches in the global I/O, in effect "slowing down" the latching clock and thus the operation of the device itself. This can cause the device cycle time to increase, which is typically undesirable.

In accordance with aspects of the present disclosure, examples of a memory device include memory banks connected to local bit lines and local word lines. Global data and/or address latches are provided in a global I/O along the lines discussed above. Further, local data and/or address latches are provided in local I/Os and local controllers to latch address and data information in response to local clock and/or enable signals. As such, these local latches may be configured to hold data and/or address information longer, and may be controlled independently of the latching clock signals controlling the global latches.

Figure 1:
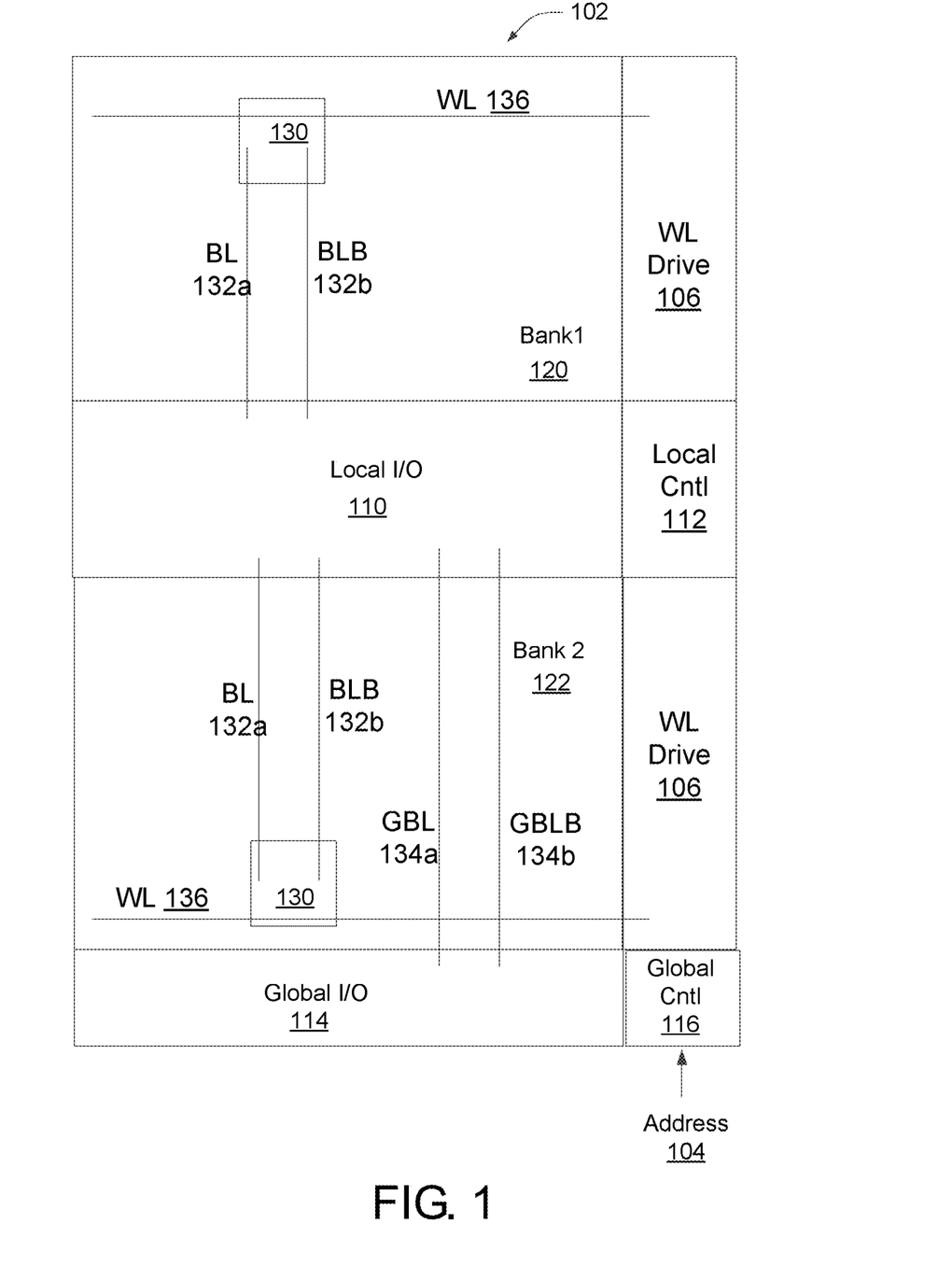
FIG. 1 is a block diagram illustrating aspects of an example memory device in accordance with some embodiments.

FIG. 1 illustrates a memory device or macro 100 in accordance with various embodiments. In the embodiment of FIG. 1, the memory device 100 is an SRAM macro, though SRAM is used for illustration. Other types of memories are within the scope of the disclosure. In the illustrated embodiment of FIG. 1, the memory device 100 includes a memory cell array 102 that has a plurality of memory banks. In FIG. 1, two memory banks 120, 122 are shown for simplicity. The memory device 100 further includes a local I/O circuit 110, a local controller 112, a global I/O circuit 114, and a global controller 116. Although, in the illustrated embodiment of FIG. 1, each component is shown as a separate block for the purpose of clear illustration, in some other embodiments, some or all of the components shown in FIG. 1 may be integrated together.

Each of the memory banks 120, 122 of the memory cell array 102 includes a plurality of memory cells 130. In FIG. 1, only a single memory cell 130 is shown in each of the memory banks 120, 122 for ease of illustration. The memory cells 130 (sometimes referred to as "bit cells") are arranged in a column-row configuration in which each column has a bit line (BL) 132a and a bit line bar (BLB) 132b and each row has a word line (WL) 136. More specifically, the BL 132a and BLB 132b of each column are respectively coupled to a plurality of memory cells 130 that are disposed in that column, and each memory cell 130 in that column is arranged on a different row and coupled to a respective (different) WL 136. That is, each memory cell 130 of the memory cell array 102 is coupled to a BL 132a of a column of the memory cell array 102, a BLB 132b of the column of the memory cell array 102, and a WL 136 of a row of the memory cell array 102. The WLs 136 are connected to word line driver circuits 106. In some embodiments, the BLs 132a and BLBs 132b are arranged in parallel vertically and the WLs 136 are arranged in parallel horizontally (i.e., perpendicular to the BLs and BLBs). The BL 132a and BLB 132b of each column are coupled to the local I/O 110 to transmit and receive data.

The local I/O 110 is connected to the global I/O by complementary global bit lines GBL 134a and GBLB 134b, which extend vertically parallel to the BLs 132a and BLBs 132b in the illustrated example. The global I/O 114 functions to transfer data between memory cells and other circuits outside of the memory device 100.

Figure 2:
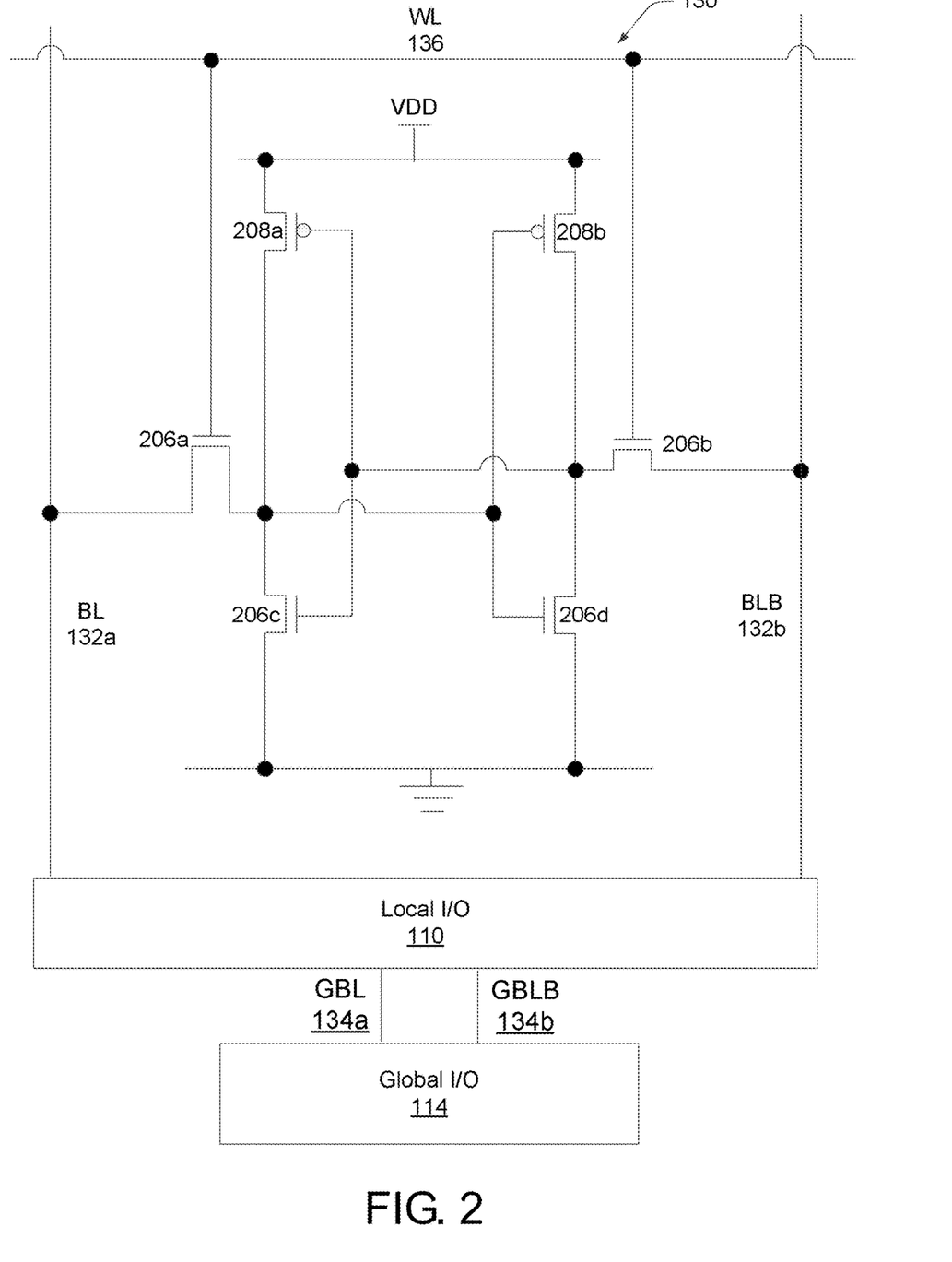
FIG. 2 is a circuit diagram of an example of a static random access memory (SRAM) cell in accordance with some embodiments.

As noted above, in some embodiments the memory device 100 is an SRAM memory, and thus the memory array 102 is an array of SRAM memory cells 130. FIG. 2 illustrates further aspects of the memory device 100, including an example of an SRAM memory cell 130 of the memory cell array 102 shown in FIG. 1. The memory cell 130 is connected to a word line 136 and complementary bit lines BL 132a and BLB 132b. The bit lines 132a, 132b are connected to the local I/O 110, which is connected to the global I/O 114 by the global bit lines GBL 134a and GBLB 134b.

The memory cell 130 includes PMOS transistors 208a, 208b and NMOS transistors 206a, 206b, 206c, 206d. The transistors 208a and 206c are coupled to one another and positioned between the supply voltage VDD and ground to form an inverter. Similarly, the transistors 208b and 206d are coupled between VDD and ground to form a second inverter. The two inverters are cross-coupled to each other. An access transistor 206a connects the output of the first inverter to the bit line BL 132a. Similarly, the access transistor 206b connects the output of the second inverter to the bit line bar 132b. The word line 136 is attached to the gate controls of the access transistors 206a and 206b to selectively couple the outputs of the inverters to the bit lines 132a, 132b during read/write operations in response to the word line drivers 106 shown in FIG. 1. During a read operation the inverters drive the complementary voltage levels at the bit lines 132a, 132b.

The cross coupled inverters of the memory cell 130 provide two stable voltage states denoting logic values 0 and 1. Metal-Oxide Semiconductor Field Effect Transistors (MOSFETs) are typically used as the transistors in the memory cell 130. In some embodiments more or fewer than 6 transistors may be used to implement the memory cell 130.

The local I/O circuit 110 is configured to access a data bit (i.e., a logical "1" or a logical "0") at each of the memory cells 130. In some embodiments, a data bit may be written to or read from a memory cell 130 by the local I/O circuit 110. Data to be written to the memory cells 130 is transmitted from the global I/O 114 to the appropriate local I/O 110 via the global bit lines 134a, 134b. Similarly, data bits to be read from the memory cells 130 are received by the local I/O 110 via the bit lines 132a, 132b, and are transmitted to the global I/O 114 via the global bit lines 134a, 134b.

Referring back to FIG. 1, the local I/O circuit 110 includes a column selector for selecting a column with the memory cells 130 to be accessed based on a decoded column address provided from a column decoder which, in one or more embodiments, is included in the global controller 116. The local I/O 110 and the global I/O 114 further include sense amplifiers for reading data from the selected memory cells 130 in a read operation. The local controller 112 provides various signals for controlling the local I/O 110 and/or the word line driver 106.

Figure 3:
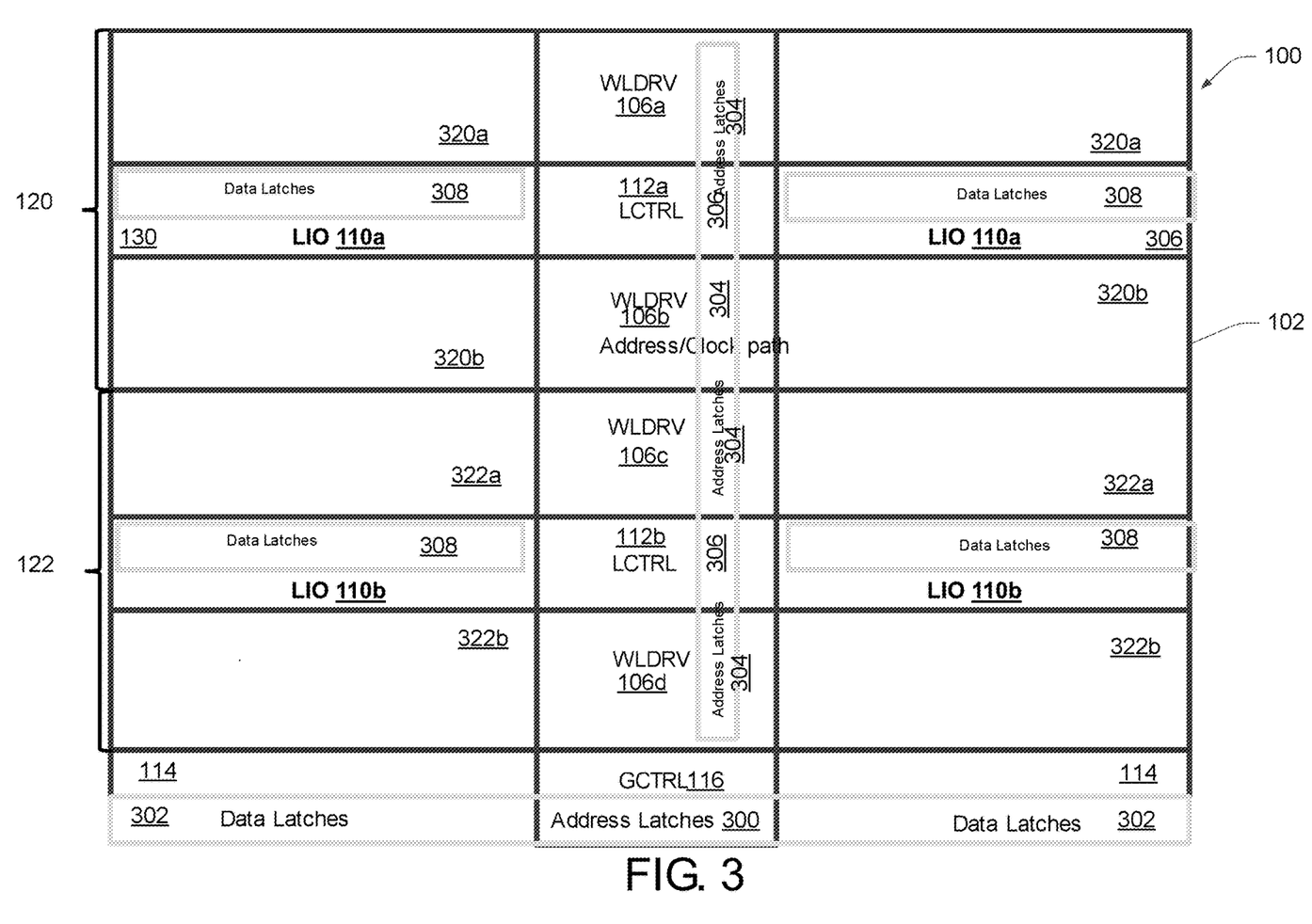
FIG. 3 is a bock diagram illustrating further aspects of an example of the memory device shown in FIG. 1 in accordance with some embodiments.

FIG. 3 illustrates further aspects of an example of the memory device 100 shown in FIGS. 1 and 2. As noted above, the memory array 102 includes a plurality of memory banks. Two memory banks 120, 122 are labeled for illustration. Each of the memory banks further includes a plurality of memory segments. In the illustrated example, memory bank 120 includes memory segments 320a and 320b, while memory bank 120 includes memory segments 322a and 322b. Different numbers and configurations of memory banks and memory segments are within the scope of the disclosure. The memory device 100 shown in FIG. 3 is symmetrical. That is, with reference to the word line drivers 106, the local control circuits 112, and the global controller 116, circuit elements on the left side are similar to circuit elements on the right side of the memory device 100.

Further, on each of the left and right side of the memory array 102, two memory segments share a row of local I/Os 110. In FIG. 3, two rows of local I/Os 110a and 110b are illustrated (collectively local I/Os 110). Thus, memory segments 320a and 320b immediately above and below the local I/O 110a are connected to the corresponding local I/O 110a by local bit lines as shown in FIGS. 1 and 2. Similarly, memory segments 322a and 322b immediately above and below the local I/O 110b are connected to the corresponding local I/O 110b. Still further, FIG. 3 illustrates four word line drivers 106a, 106b, 106c, and 106d (collectively word line drivers 106), and two local controllers 112a and 112b (collectively local controllers 112). The word line drivers 106a and 106b immediately above and below the local controller 112a are connected to the 112a, while the word line drivers 106c and 106d immediately above and below the local controller 112b are connected to the 112b. Moreover, the local I/Os 110a to the left and right of the local controller 112a are connected to the local controller 112a, while the local I/Os 110b to the left and right of the local controller 112b are connected to the local controller 112b. Similarly, the global I/Os 114 to the left and right of the global controller 116 are connected to the global controller 116.

As noted above, the global controller 116 controls data transfer between the memory cells 130 and circuits outside the memory device 100. As such, the global controller 116 and global I/O 114 include latches for storing address information and data at the interface between the memory device 100 and external devices. More particularly, the global controller 116 includes global address latches 300 configured to store received address information, and the global I/O has global data latches 302 configured to store data read from the memory cells 130 and data to be written to the memory cells 130. Moreover, the word line drivers 106 and the local controllers 112 include local address latches 304, 306, respectively, and the local I/Os 110 include local data latches 308.

Figure 4:
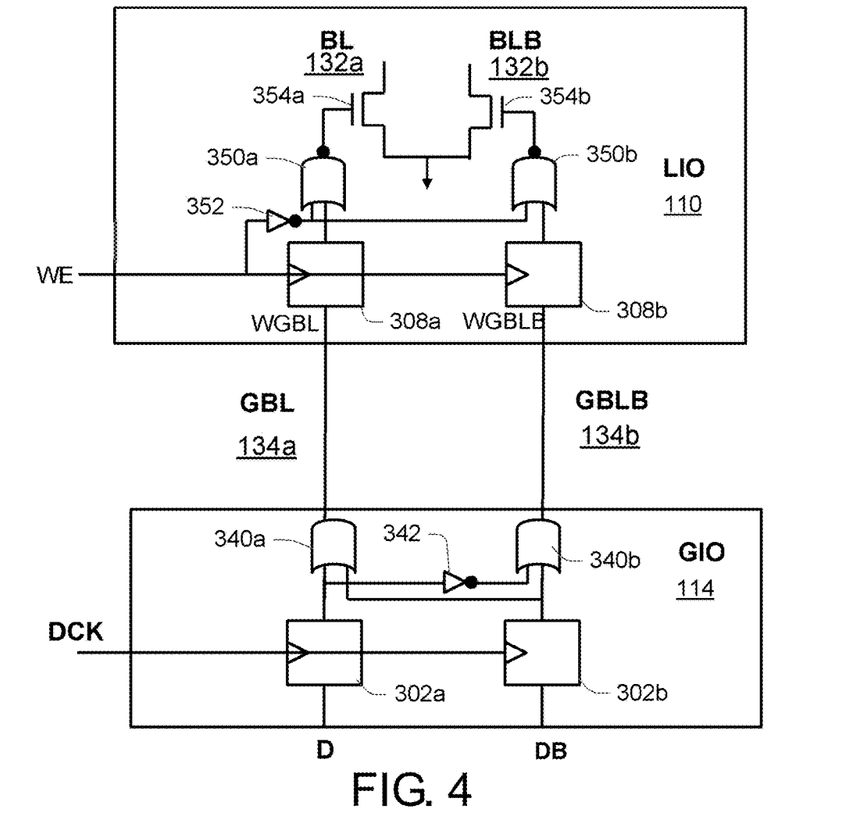
FIG. 4 is a block diagram illustrating further aspects of an example of the memory device shown in FIG. 1 in accordance with some embodiments.

FIG. 4 is a block diagram illustrating further aspects of the global I/O 114 and the local I/O 110 as configured for write operations. As noted above, the local I/O 110 is connected to the global I/O 114 by the global bit lines 134a, 134b. In the example shown in FIG. 4, global I/O 114 includes two global data latches 302a, 302b that are controlled by a global clock signal DCK received at an enable input. The global data latches 302a, 302b are coupled to receive complementary data signals D, DB. First and second OR gates 340a, 340b have one input coupled to respective outputs of the global data latches 302a, 302b. A second input of the OR gate 340 receives the output of the second global data latch 340b, while a second input of the OR gate 340b receives an inverse of the output of the first global data latch 302a via an inverter 342. Thus, when the global clock signal DCK goes high, the data signals are output from the global I/O 114 to the local I/O 110 on the global bit lines 134a, 134b.

The local I/O 110 includes local data latches 308a, 308b that are respectively connected to the global bit lines 134a, 134b to receive complementary data outputs WBGL, WBGLB from the global data latches 302a, 302b. While the global data latches 302a, 302b are controlled by the global clock signal DCK, the local data latches 308a, 308b are controlled by a local clock signal, which in the example of FIG. 4 is a write enable WE signal. The local I/O 110 further includes NOR gates 350a, 350b that receive outputs of the local data latches 308a, 308b. The NOR gates 350a, 350b also receive an inverse of the WE signal via an inverter 352. The outputs of the NOR gates 350a, 350b are coupled to respective gate terminals of NMOS transistors 354a, 354b.

When the WE signal is at logic low, the local bit lines 132a, 132b are isolated from the data signals on the global bit lines 134a, 134b while the local data latches 308a, 308b evaluate the data signals WGBL and WGBLB. More specifically, the low WE signal is inverted by the inverter 352 so one input of each of the NOR gates 350a, 350b receives a logic high signal. The high input to the NOR gates 350a, 350b drives the corresponding outputs low regardless of the data signals received by the second inputs of the respective NOR gates 350a, 350b, turning off the transistors 354a, 354b.

When the WE signal goes high, the data signals WBGL and WBGLB are latched by the local latches 308a, 308b. The inverted WE signal (now logic low) is received by the NOR gates 350a, 350b, such that the data signals output by the local data latches 308a, 308b are in turn output by the NOR gates 350a, 350b to the gates of the respective transistors 354a, 354b.

Figure 5:
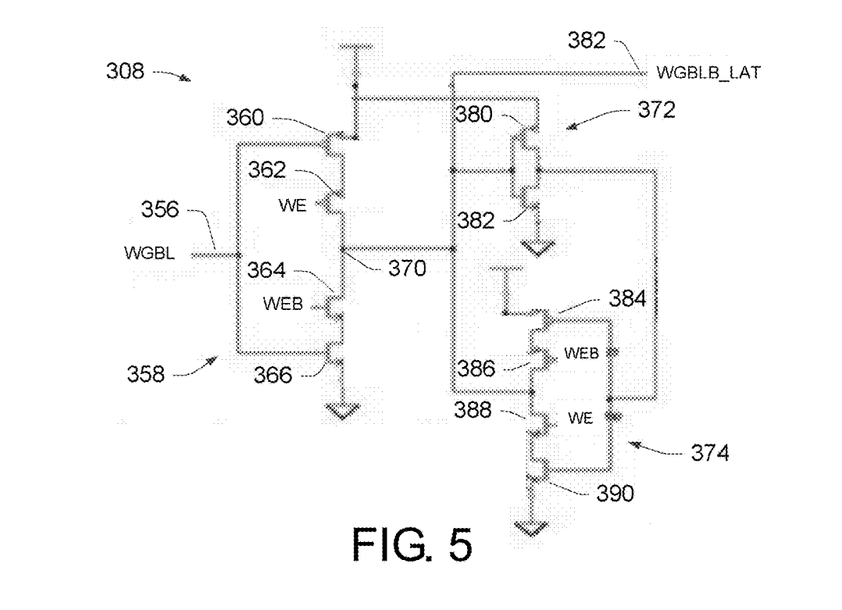
FIG. 5 is a circuit diagram illustrating an example of further aspects of the block diagram of FIG. 4 in accordance with some embodiments.

FIG. 5 is a circuit diagram illustrating an example implementation of the local data latches 308. The illustrated local data latch 308 receives the WGBL signal at an input terminal 356, and thus corresponds to the local data latch 308a shown in FIG. 4. The structure of the local data latch 308b is the same, though as shown in FIG. 4 the WGBLB signal is received at its input. The illustrated local data latch 308 includes a first inverter 358 made up of a PMOS transistor 360 and an NMOS transistor 366 connected between a VDD voltage terminal and ground. A PMOS transistor 362 and an NMOS transistor 364 are coupled between the transistors 360 and 366. The PMOS transistor 362 receives the WE signal at its gate terminal, and the NMOS transistor receives the complement of the WE signal WEB signal at its gate terminal. A junction of the transistors 362 and 364 forms a node 370 that is input to a latch circuit formed by cross coupled inverters 372 and 374. The first inverter 372 includes a PMOS transistor 380 and an NMOS transistor 382 coupled between the VDD voltage terminal and ground, and an output of the first inverter 372 is coupled to an input of the second inverter 374. The second inverter 374 includes a PMOS transistor 384 and an NMOS transistor 390 connected between the VDD voltage terminal and ground. A PMOS transistor 386 and an NMOS transistor 388 are coupled between the transistors 384 and 390. The PMOS transistor 386 receives the WEB signal at its gate terminal, and the NMOS transistor 390 receives the WE signal at its gate terminal. The cross coupled inverters 372 and 374 latch the signal received at the node 370, which is output at an output terminal 382.

When the WE signal is low, the input data signal at the input terminal 356 is received by the local data latch such that the signal at the output terminal 382 tracks the input signal (outputting the complement thereof). More specifically, the low WE signal and the high WEB signal turn on the PMOS transistor 362 and the NMOS transistor 364 so the inverted input signal is output at the node 370, and thus, the output terminal 382 as well. The low WE signal and the high WEB signal turn off the PMOS transistor 386 and the NMOS transistor 388 so the output node 382 is isolated from the inverter 374. As such, the intermediate signal output by the inverter 372 is not inverted and transmitted to the node 370 by the inverter 374.

When the WE signal goes high, the high WE signal and the low WEB signal turn on the PMOS transistor 386 and the NMOS transistor 388, so the intermediate signal output by the inverter 372 is inverted and transmitted to the node 370 by the inverter 374, latching the WGBLB_LAT signal at the output terminal 382. The high WE signal and the low WEB signal turn off the PMOS transistor 362 and the NMOS transistor 364 so the WGBL signal received at the input terminal is not inverted and output at the node 370. Thus, the output signal WGBLB_LAT at the output terminal 382 is latched and does not track changes in the input signal received at the input terminal 356.

Figure 6:
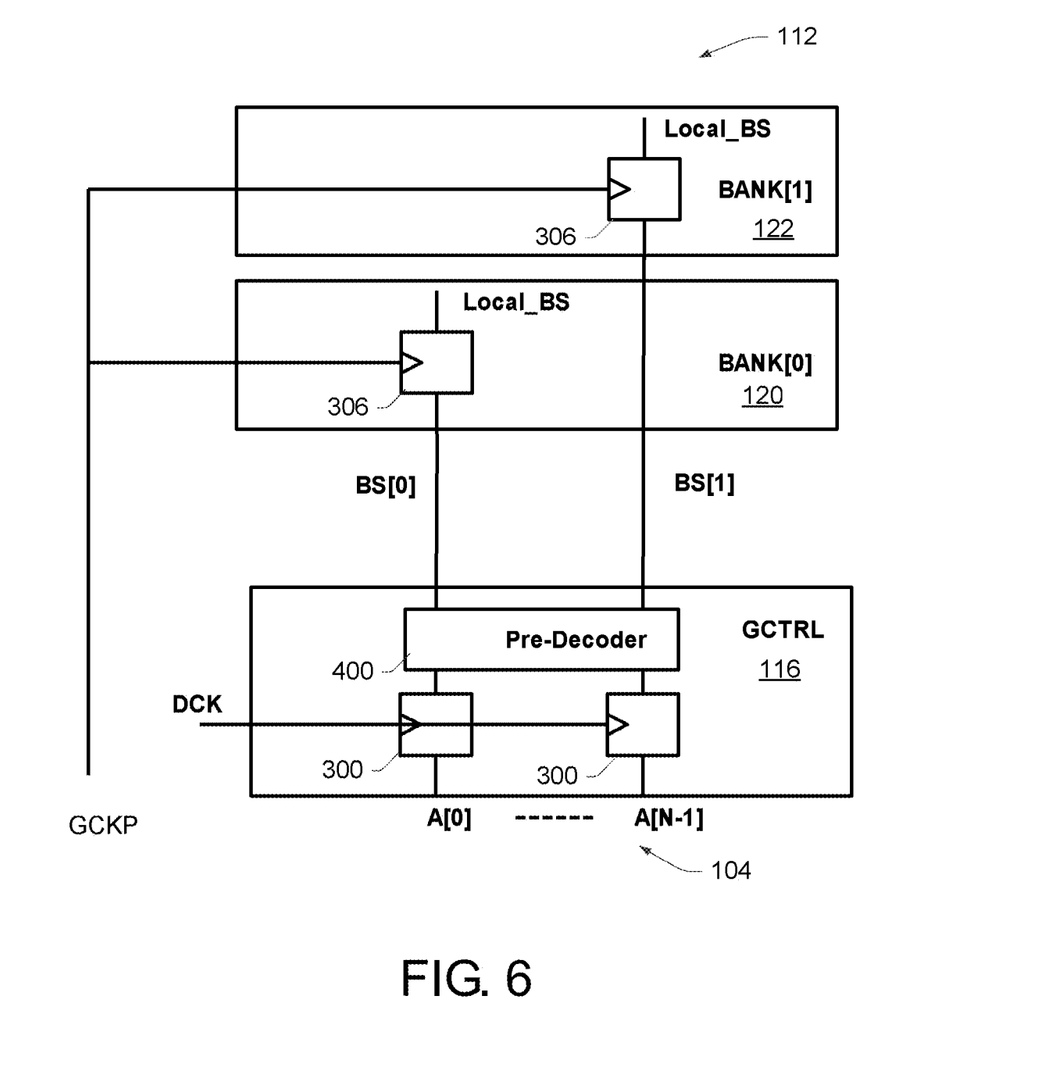
FIG. 6 is a block diagram illustrating further aspects of an example of the memory device shown in FIG. 1 in accordance with some embodiments.

FIG. 6 illustrates an example of aspects of the global controller 116 and the local controller 112. The global controller 116 includes a plurality of the global address latches 300 that receive respective bits A0-A[N−1] of the memory address 104. The global address latches 300 output the respective address bits A[0]-A0N−1] to a pre-decoder 400 in response to the global clock signal DCK. In the illustrated example, the pre-decoder outputs bank select signals BS[0] and BS[1] to the local address latches 306 in the local IOs 110 associated with the illustrated memory banks 120, 122. In the illustrated example, the local address latches 306 are local bank select latches. The local bank select latches 306 operate in response to a local address latch clock signal GCKP to output a local bank select signal Local_BS.

Figure 7:
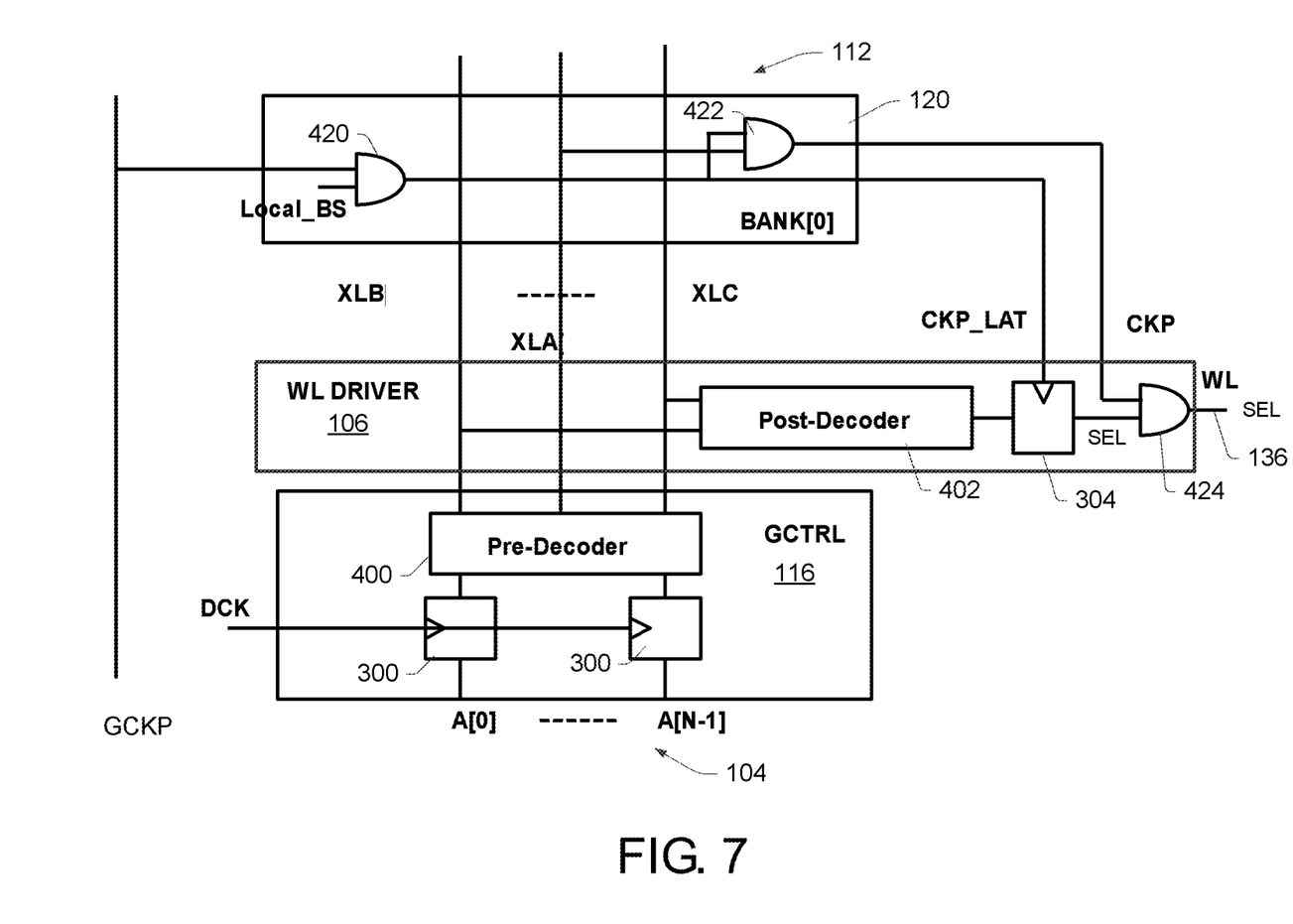
FIG. 7 is a block diagram illustrating further aspects of an example of the memory device shown in FIG. 1 in accordance with some embodiments.

FIG. 7 illustrates an example of further aspects of the global controller 116 and word line drivers 106. As noted above, the global controller 116 has the plurality of the global address latches 300 that receive respective bits A0-A [N−1] of the memory address 104. The global address latches 300 output the respective address bits A[0]-A0N−1] to the pre-decoder 400 in response to the global clock signal DCK. In addition to the bank select BS[0], BS[1] signals shown in FIG. 6, the predecoder 400 outputs signals XLA, XLB, and XLC. The XLB and XLC signals are received by the word line drivers 106 of the selected memory bank 120 (only one word line driver 106 is shown in FIG. 7 for ease of illustration). A post-decoder 402 receives the XLB XLC address signals and outputs the word line select signal SEL for the corresponding word line 136. The local address latch 304 is a word line select latch in the illustrated example. Thus, the word line select signal is received by the local word line address latch 304, which latches and outputs the word line select signal SEL to an AND gate 410 in response to a word line latch clock signal CKP_LAT that is derived from the local address latch clock signal GCKP as will be discussed further below.

The local I/O 110 for the first memory bank 120 further receives the XLA signal from the pre-decoder 400, along with the local address latch clock signal GCKP. More specifically, an AND gate 420 receives the CGKP signal and the local bank select signal Local_BS from the local bank select latch 306 shown in FIG. 6. Thus, the AND gate 420 outputs the word line latch clock signal CKP_LAT to the word line address latch 304 for the selected memory bank 120 based on the GCKP signal. In other words, if the Local_BS signal is high (i.e. the first BANK[0] 120 is selected), the CKP_LAT signal tracks the GCKP signal to control the word line address latch 304. A second AND gate 422 also receives the CKP_LAT signal, along with the XLA signal. In response to the CKP_LAT signal, a CKP signal based on the XLA address bit is output to an AND gate 424. The AND gate 424 also receives the word line select signal SEL output by the word line address latch 304, to in turn output the appropriate word line select signal SEL to the corresponding word line 136 in response to the CKP signal.

Figure 8:
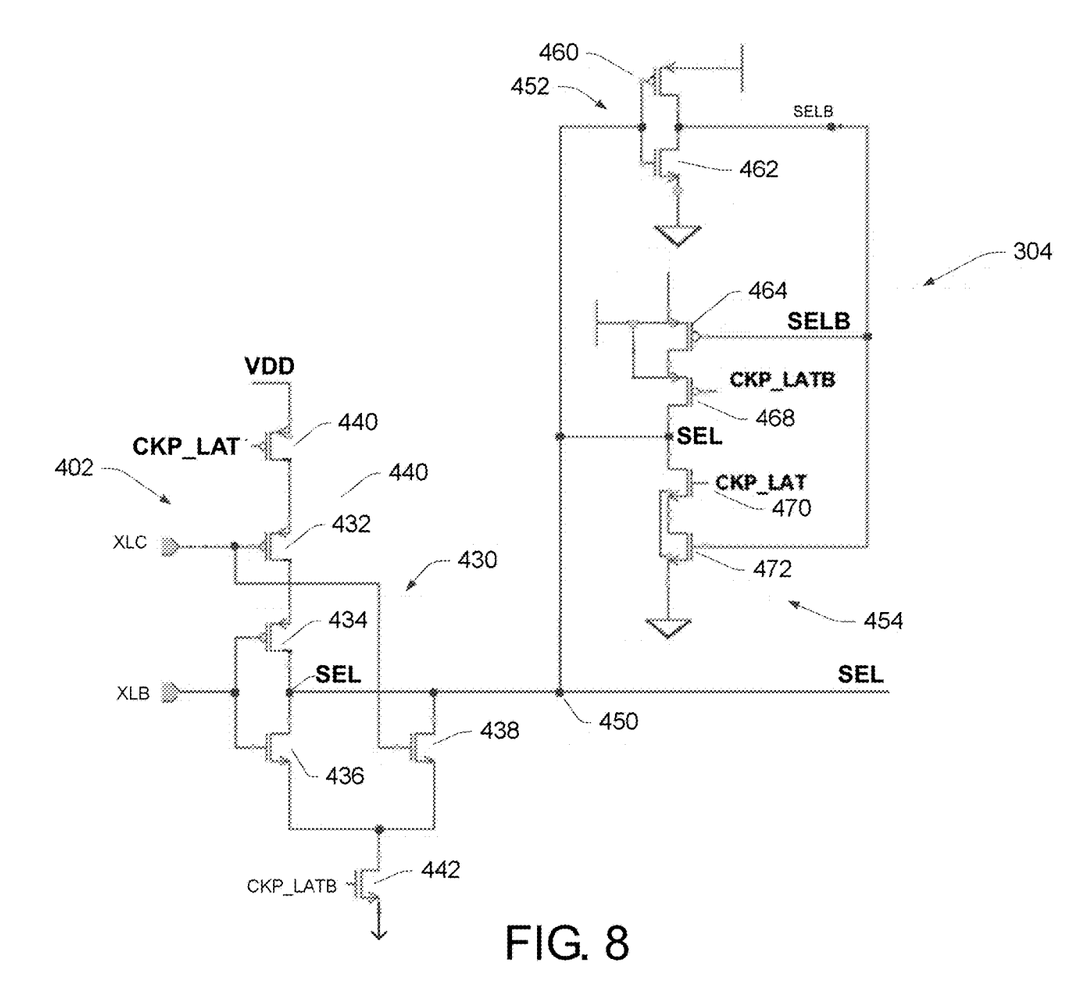
FIG. 8 is a circuit diagram illustrating an example of further aspects of the block diagram of FIG. 7 in accordance with some embodiments.

FIG. 8 is a schematic diagram illustrating an example implementation of aspects of the word line driver 106. More particularly, FIG. 8 illustrates portions of an embodiment of the post-decoder 402 and the word line address latch 304. The post-decoder 402 includes a NOR gate 430 that receives the XLB and XLC address signals as inputs. The NOR gate 430 includes a PMOS transistor 432 and an NMOS transistor 438 that each receive the XLC signal at their gate terminals. A PMOS transistor 434 and an NMOS transistor 436 receive the XLB signal at their gate terminals, and the NOR gate 430 outputs the word line select signal SEL at an output node 450 based on the XLB and XLC signals. Additionally, a PMOS transistor 440 coupled between the VDD voltage terminal and the transistor 432 receives the CKP_LAT signal, and an NMOS transistor 442 coupled between the transistors 436 and 438 and ground receives a complement of the CKP_LAT signal, CKP_LATB. Thus, when the CKP_LAT signal is low (CKP_LATB is high), the NOR gate 430 is isolated from the VDD terminal and ground.

The output node is input to the word line address latch 304. The first inverter 452 is made up of a PMOS transistor 460 and an NMOS transistor 462 connected between the VDD voltage terminal and ground. An output of the first inverter 452 is coupled to an input of the second inverter 454. The second inverter 454 includes a PMOS transistor 464 and an NMOS transistor 472 connected between the VDD voltage terminal and ground. A PMOS transistor 468 and an NMOS transistor 470 are coupled between the transistors 464 and 470. The PMOS transistor 468 receives the CKP_LATB signal at its gate terminal, and the NMOS transistor 470 receives the CKP_LAT signal at its gate terminal. The cross coupled inverters 452 and 454 latch the SEL signal received at the node.

When the CKP_LAT signal is low, the SEL signal at the node 450 is received by the word line address latch 304 such that the SEL signal tracks the output of the NOR gate 430. More specifically, the low CKP_LAT signal and the high CKP_LATB signal turn on the PMOS transistor 440 and the NMOS transistor 442 so the output of the NOR gate 430 (i.e. SEL signal) is received at the node 450. The low CKP_LAT signal and the high CKP_LATB signal turn off the PMOS transistor 468 and the NMOS transistor 470 so the output node 450 is isolated from the output of the inverter 454. As such, the intermediate signal output by the inverter 462 is not inverted and transmitted to the node 450 by the inverter 454.

When the CKP_LAT signal goes high, the high CKP_LAT signal and the low CKP_LATB signal turn on the PMOS transistor 468 and the NMOS transistor 470, so the intermediate signal output by the inverter 452 is inverted and transmitted to the node 450 by the inverter 454, latching the SEL signal. The high CKP_LAT signal and the low CKP_LATB signal turn off the PMOS transistor 440 and the NMOS transistor 442 connected to the NOR gate 430, so the output of the NOR gate 430 is not received at the node 450. Thus, the SEL signal at the output terminal 450 is latched and does not track the output of the NOR gate 430.

Figure 9:
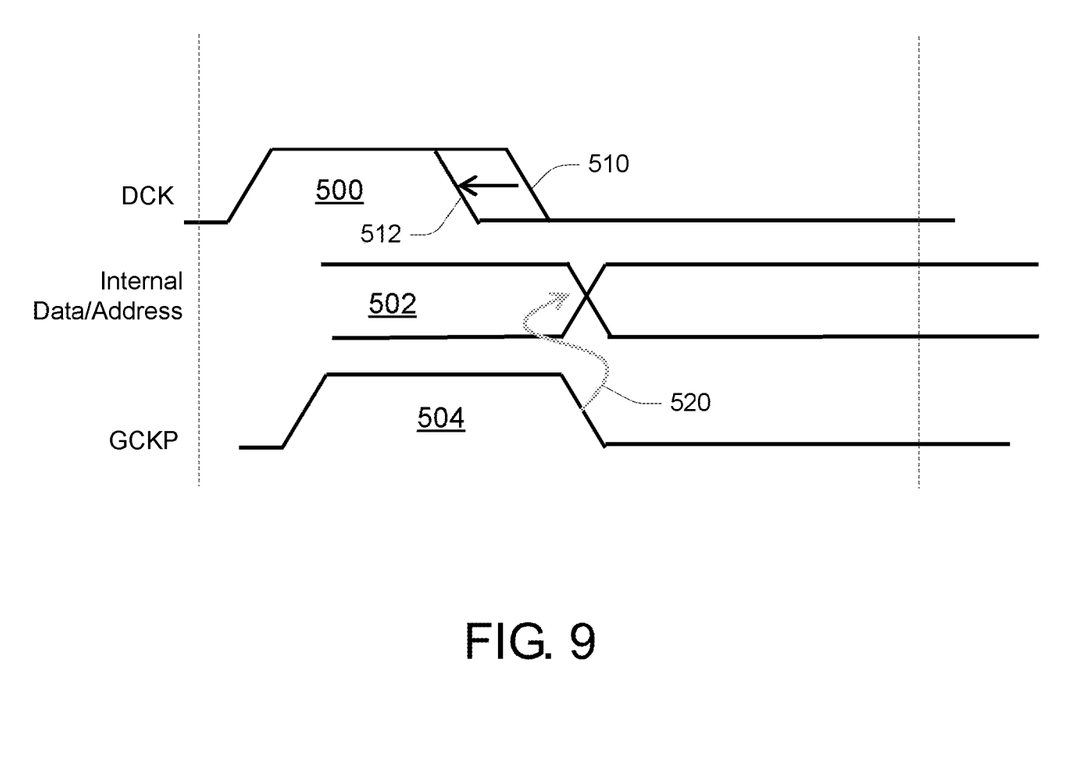
FIG. 9 is a chart illustrating example signal wave forms for the memory device shown in FIG. 1 in accordance with some embodiments.

FIG. 9 is a chart illustrating various waveforms in accordance with disclosed examples. More particularly, FIG. 9 includes a global latch clock DCK signal wave form 500, an internal data/address waveform 502, and a local latch clock GCKP signal waveform 504. As noted above, the DCK global clock signal 500 is a global clock signal that controls operation of the global address latches 300 and the global data latches 302. When the DCK global latch signal 500 is low, new address and data information is received by the global address latches 300 and global data latches 302, respectively. When the DCK signal goes high, the global address latches 300 and the global data latches 302 latch the received information.

When the DCK signal transitions back to logic low as indicated at 510, new data is again received by the global address latches 300 and the global data latches 302. The waveform 502 conceptually illustrates data and/or address signals transitioning from logic high to low or low to high. With some conventional latching arrangements where data and address information is sent directly from global latches to memory cells through local I/O and control blocks, a "collision" may occur if new data is received by the global latches before memory operations are complete. However, in accordance with disclosed embodiments, the data and address information from the global address latches 300 and global data latches is received and latched by local latches 308 and local address latches 304, 306, which are controlled by local clock signals. For example, the address latches 304, 306 operate in response to a local address latch clock signals GCKP, which is shown in the waveform 504. As indicated by the arrow 520, the internal data/address signals 502 are latched in response to the local address clock signals GCKP, independently of the global clock signal DCK. In some examples, this allows shortening the pulse width of the DCK signal 500 by moving its falling edge from the position indicated at 510 to the position indicated at point 512.

Figure 10:
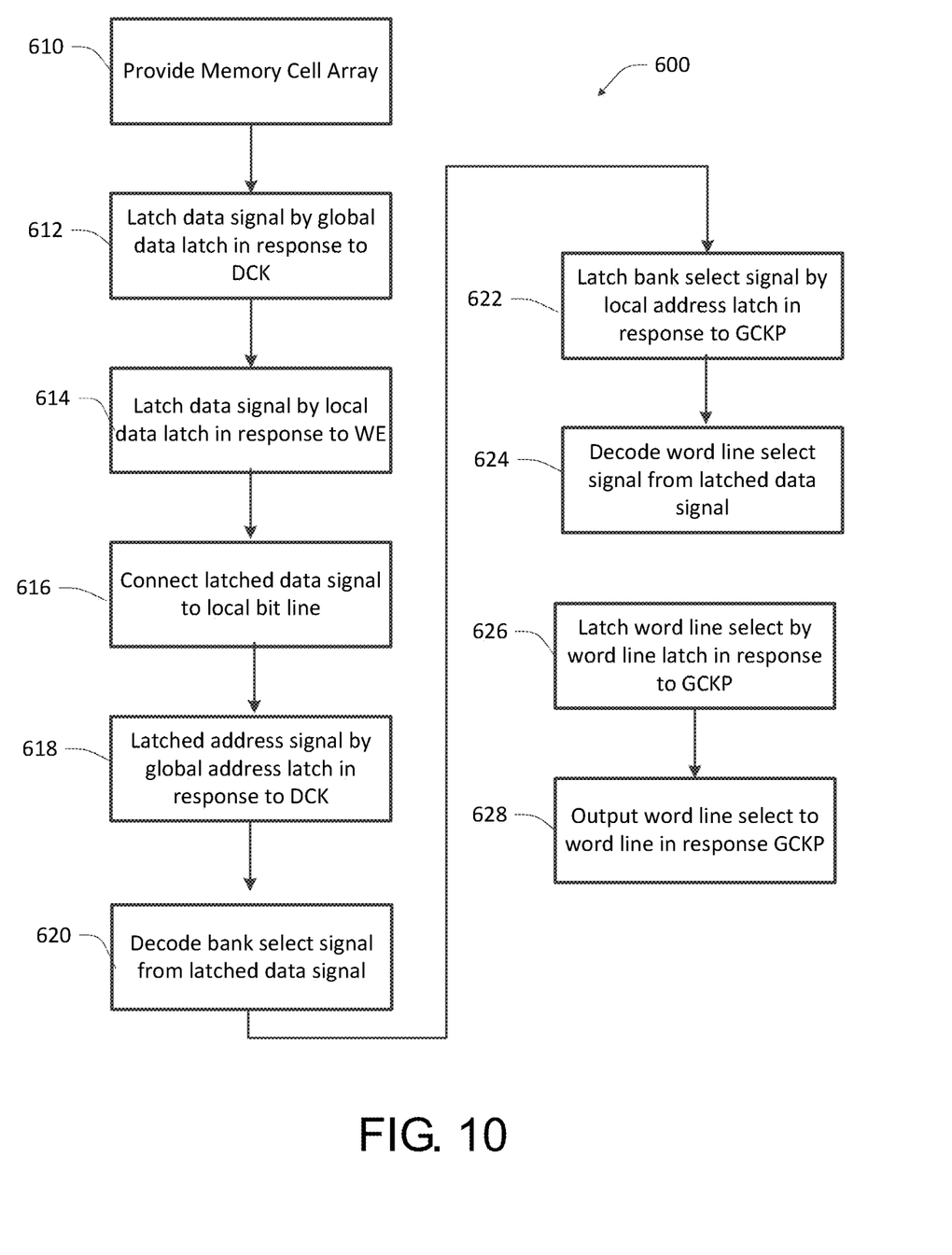
FIG. 10 is a flow diagram illustrating an example method in accordance with some embodiments.

FIG. 10 is a flow diagram illustrating aspects of a method 600 in accordance with some embodiments. The method may be executed by the various embodiments of the memory device 100 disclosed herein. The method includes providing a memory bank such as the memory bank 120 that has a memory cell 130 connected to a local bit line 132a, 132b and a word line 136 at step 610. At step 612, a data signal D is latched by a global data latch 302 in response to a global clock signal DCK. The data signal is also latched by a local data latch 308a in response to a first local clock signal WE at step 614. The latched data signal is connected to the local bit line 132 in response to the first local clock signal WE at step 616. As shown in FIG. 4, when the first local clock signal WE is high, the local data latch 308a latches the received WGBL signal from the global data latch 302a, and the complement of the local clock signal WE is also received by the NOR gate 350a to selectively output the latched signal from the local data latch 308a to the gate of the transistor 354a.

At step 618, an address signal is latched by a global address latch 300 in response to the global clock signal DCK. A bank select signal is decoded from the latched data signal at step 620 by the pre-decoder 400, for example. The bank select signal Local_BS is latched by a local address latch 306 in response to a second local clock signal GCKP in step 622. In step 624, a word line select signal is decoded from the latched data signal by the pre-decoder 400 and post decoder 402, for example. The word line select signal is latched by a word line latch 304 in response to the second local clock signal GCKP in step 626. The word line select signal SEL is output to the word line 136 in response to the second local clock signal GCKP in step 628.

Thus, in accordance with some disclosed embodiments, a memory device such as an SRAM device includes a memory bank with a memory cell connected to a local bit line and a word line. A first local data latch is connected to the local bit line, and the first local data latch has an enable terminal configured to receive a first local clock signal. A word line latch is configured to latch a word line select signal. The word line latch has an enable terminal configured to receive a second local clock signal. A first global data latch is connected to the first local data latch by a global bit line, and the first global data latch has an enable terminal configured to receive a global clock signal. A global address latch is connected to the word line latch and has an enable terminal configured to receive the global clock signal.

In accordance with further embodiments, a memory device such as an SRAM device includes a memory array with a first memory bank having a first memory cell connected to a first local bit line and a first word line. A first local I/O includes a first local data latch connected to the first local bit line, and the first local data latch has an enable terminal configured to receive a first local clock signal. A first local controller is connected to the first memory bank, and the first local controller has a first bank select latch configured to latch a first bank select signal. The first bank select latch has an enable terminal configured to receive a second local clock signal. A global controller is connected to the first local controller and the global controller is config-ured to receive a memory address. The global controller has a global address latch configured to latch an address signal, and also has an enable terminal configured to receive a global clock signal. A global I/O is connected to the first local I/O and has a first global data latch configured to receive a data signal. The first global data latch is connected to the first local I/O by a global bit line, and the first global data latch has an enable terminal configured to receive the global clock signal.

In accordance with still further examples, a method includes providing a memory bank with a memory cell connected to a local bit line and a word line. A data signal is latched by a global data latch in response to a global clock signal. The data signal is also latched by a local data latch in response to a first local clock signal. The latched data signal is connected to the local bit line in response to the first local clock signal. An address signal is latched by a global address latch in response to the global clock signal, and a bank select signal is decoded from the latched data signal. The bank select signal is latched by a local address latch in response to a second local clock signal. A word line select signal is decoded from the latched data signal, and the word line select signal is latched by a word line latch in response to the second local clock signal. The word line select signal is output to the word line in response to the second local clock signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory bank including a memory cell connected to a local bit line and a word line;
   a first local data latch connected to the local bit line, the first local data latch having an enable terminal configured to receive a first local clock signal;
   a word line latch configured to latch a word line select signal, the word line latch having an enable terminal configured to receive a second local clock signal;
   a first global data latch connected to the first local data latch by a global bit line, the first global data latch having an enable terminal configured to receive a global clock signal;
   a global address latch connected to the word line latch, the global address latch having an enable terminal configured to receive the global clock signal; and
   a NOR gate including:
      a first input connected to receive an output of the first local data latch;
      a second input connected to the first local clock signal via an inverter; and
      an output connected to the bit line.

2. The memory device of claim 1, further comprising a bank select latch configured to latch a bank select signal, the bank select latch having an enable terminal configured to receive the second local clock signal, wherein the global address latch is connected to the bank select latch.

3. The memory device of claim 1, further comprising a transistor connected between the bit line and a ground terminal, the transistor including a gate terminal connected to the output of the NOR gate.

4. The memory device of claim 3, further comprising a plurality of the memory banks, wherein:
the bank select signal is configured to select one of the memory banks based on an address signal received by the global address latch.

5. The memory device of claim 4, further comprising:
a first AND gate having a first input configured to receive the second local clock signal, a second input configured to receive the bank select signal, and an output connected to the enable terminal of the word line latch;
a second AND gate having a first input coupled to the output of the first AND gate and a second input connected to the global address latch; and
a third AND gate having a first input connected to an output of the word line latch, a second input connected to an output of the second AND gate, and an output connected to the word line.

6. The memory device of claim 1, further comprising a second global data latch, wherein the first global data latch is configured to receive a first data bit and the second global data latch is configured to receive a complement of the first data bit.

7. The memory device of claim 6, wherein the memory cell is further connected to a local bit line bar, the memory device further comprising a second local data latch connected to the local bit line bar, wherein the second global data latch is connected to the second local data latch by a global bit line bar.

8. The memory device of claim 7, further comprising:
a first OR gate having a first input connected to an output of the first global data latch, a second input connected to an output of the second global data latch, and an output connected to the global bit line; and
a second OR gate having a first input connected to the output of the second global data latch, a second input connected to the output of the second global data latch via an inverter, and an output connected to the global bit line bar.

9. A memory device, comprising:
a memory array including a first memory bank having a first memory cell connected to a first local bit line and a first word line;
a first local I/O including a first local data latch connected to the first local bit line, the first local data latch having an enable terminal configured to receive a first local clock signal;
a first local controller connected to the first memory bank, the first local controller having a first bank select latch configured to latch a first bank select signal received from an address decoder circuit, the first bank select latch having an enable terminal configured to receive a second local clock signal;
a global controller connected to the first local controller, the global controller configured to receive a memory address, the global controller having a global address latch configured to latch an address signal and having an enable terminal configured to receive a global clock signal; and
a global I/O connected to the first local I/O, the global I/O including a first global data latch configured to receive a data signal and connected to the first local I/O by a global bit line, the first global data latch having an enable terminal configured to receive the global clock signal.

10. The memory device of claim 9, further comprising a word line driver connected to the global controller, the word line driver including a word line latch configured to latch a word line select signal, the word line latch having an enable terminal configured to receive the second local clock signal, wherein the global address latch is connected to the word line latch.

11. The memory device of claim 10, wherein the first local controller is configured to output the second local clock signal to the enable terminal of the word line driver.

12. The memory device of claim 11, wherein the first local controller includes:
a first AND gate having a first input configured to receive the second local clock signal, a second input configured to receive the bank select signal, and an output connected to the enable terminal of the word line latch; and
a second AND gate having a first input coupled to an output of the first AND gate and a second input connected to the global address latch.

13. The memory device of claim 12, wherein the word line driver includes a third AND gate having a first input connected to an output of the word line latch, a second input connected to an output of the second AND gate, and an output connected to the word line.

14. The memory device of claim 9, wherein the memory array includes a second memory bank having a second memory cell connected to a second local bit line and a second word line;
a second local I/O including a second local data latch connected to the second local bit line, the second local data latch having an enable terminal configured to receive the first local clock signal;
a second local controller coupled to the second memory bank, the second local controller having a second bank select latch configured to latch a second bank select signal, the second bank select latch having an enable terminal configured to receive the second local clock signal;
wherein the global controller is connected to the second local controller, and
wherein the global I/O is connected to the second local I/O.

15. The memory device of claim 9, wherein the first memory cell is connected to a first local bit line bar, and wherein the local I/O includes a second local data latch connected to the first local bit line bar, the first local data latch having an enable terminal configured to receive the first local clock signal.

16. The memory device of claim 15, wherein the global I/O includes a second global data latch connected to the first local I/O by a global bit line bar, the local I/O including:
a first NOR gate having a first input connected to receive an output of the first local data latch, a second input connected to receive the first local clock signal via an inverter, and an output connected to the bit line; and
a second NOR gate having a first input connected to receive an output of the second local data latch, a second input connected to the first input of the first NOR gate, and an output connected to the bit line bar.

17. The memory device of claim 9, wherein the global address latch in the global controller is connected to the address decoder circuit that provides the first bank select signal.

18. A method, comprising:
- providing a memory bank including a memory cell connected to a local bit line and a word line;
- latching a data signal by a global data latch in response to a global clock signal;
- latching the data signal by a local data latch in response to a first local clock signal;
- connecting the latched data signal to the local bit line in response to the first local clock signal;
- latching an address signal by a global address latch in response to the global clock signal;
- decoding a bank select signal from the latched address signal;
- latching the bank select signal in a bank select latch in response to a second local clock signal;
- decoding a word line select signal from the latched address signal;
- latching the word line select signal in a word line latch in response to the second local clock signal; and
- outputting the word line select signal to the word line in response to the second local clock signal.

19. The method of claim 18, further comprising sending the data signal from the global data latch to the local data latch via a global bit line.

20. The method of claim 18, wherein the word line select signal is latched by a word line latch further in response to the bank select signal.

* * * * *